United States Patent
Konno et al.

(10) Patent No.: US 12,065,725 B2
(45) Date of Patent: Aug. 20, 2024

(54) FILM FORMING APPARATUS AND FILM FORMING METHOD

(71) Applicant: Kioxia Corporation, Minato-ku (JP)

(72) Inventors: Yuta Konno, Kuwana (JP); Toshihiko Nagase, Saitama (JP); Atsuko Sakata, Yokkaichi (JP); Kohei Nagata, Yokkaichi (JP); Ryohei Kitao, Yokkaichi (JP); Akifumi Gawase, Kuwana (JP); Takeshi Iwasaki, Kuwana (JP)

(73) Assignee: Kioxia Corporation, Minato-ku (JP)

( * ) Notice: Subject to any disclaimer, the term of this patent is extended or adjusted under 35 U.S.C. 154(b) by 1019 days.

(21) Appl. No.: 17/002,822

(22) Filed: Aug. 26, 2020

(65) Prior Publication Data

US 2021/0087669 A1 Mar. 25, 2021

(30) Foreign Application Priority Data

Sep. 20, 2019 (JP) .................. 2019-171007
Jul. 9, 2020 (JP) .................. 2020-118373

(51) Int. Cl.
*C23C 14/00* (2006.01)
*B01D 53/30* (2006.01)
(Continued)

(52) U.S. Cl.
CPC .......... *C23C 14/0036* (2013.01); *B01D 53/30* (2013.01); *C23C 14/0641* (2013.01);
(Continued)

(58) Field of Classification Search
CPC .. C23C 14/0036; C23C 14/0641; B01D 53/30
See application file for complete search history.

(56) References Cited

U.S. PATENT DOCUMENTS

| | | | |
|---|---|---|---|
| 2002/0015855 A1* | 2/2002 | Sajoto | C23C 16/45561 204/192.12 |
| 2010/0071549 A1* | 3/2010 | Grant | C23C 16/4412 95/20 |
| 2014/0182357 A1* | 7/2014 | Miyauchi | C23C 16/4412 73/23.31 |

FOREIGN PATENT DOCUMENTS

| | | |
|---|---|---|
| JP | 7-58032 A | 3/1995 |
| JP | 10-309434 A | 11/1998 |

(Continued)

OTHER PUBLICATIONS

"Solution > High-purity Hydrogen Oxygen Generator FAQ (Hydrogen Generator)", Kobelco Eco-Solutions Co., Ltd., retrieved from https://www/kobelcoeco.co.jp/product/hhog/faq.html#, Oct. 17, 2023, 4 pages (with Partial English Translation).

(Continued)

*Primary Examiner* — John J Brayton
(74) *Attorney, Agent, or Firm* — Oblon, McClelland, Maier & Neustadt, L.L.P.

(57) ABSTRACT

A film forming apparatus according to an embodiment includes: a process chamber forming a film on a substrate; an abatement device detoxifying a first exhaust gas exhausted from the process chamber; a first supply pipe for supplying a gas containing water to the process chamber; a first vacuum pump provided in a first flow path of the first exhaust gas between the process chamber and the abatement device; a second vacuum pump provided in the first flow path between the first vacuum pump and the abatement device; and a first detector provided in the first flow path between the second vacuum pump and the abatement device and capable of detecting a hydrogenated gas.

21 Claims, 11 Drawing Sheets

(51) Int. Cl.
*C23C 14/06* (2006.01)
*C23C 14/08* (2006.01)
*C23C 14/50* (2006.01)
*C23C 14/52* (2006.01)
*C23C 14/54* (2006.01)
*C23C 14/56* (2006.01)

(52) U.S. Cl.
CPC .............. *C23C 14/08* (2013.01); *C23C 14/50* (2013.01); *C23C 14/52* (2013.01); *C23C 14/54* (2013.01); *C23C 14/566* (2013.01)

(56) References Cited

FOREIGN PATENT DOCUMENTS

| | | |
|---|---|---|
| JP | 2001-353423 A | 12/2001 |
| JP | 2003-205219 A | 7/2003 |
| JP | 2005-216982 A | 8/2005 |
| JP | 2012-222334 A | 11/2012 |
| WO | WO 2010/103847 A1 | 9/2010 |

OTHER PUBLICATIONS

"Conversion table of volume fraction (moisture concentration), absolute humidity (vapour density) and relative humidity to atmospheric pressure dew point (dew point)", retrieved from https://official.koganel.co.ip/common/pdf/tech/E4041volume_rate_conversion.pdf, Oct. 17, 2023, 2 pages (with Partial English Translation).

\* cited by examiner

FILM FORMING APPARATUS AND FILM FORMING METHOD

CROSS-REFERENCE TO RELATED APPLICATION

This application is based upon and claims the benefit of priority from Japanese Patent Application No. 2019-171007, filed on Sep. 20, 2019, and Japanese Patent Application No. 2020-118373, filed on Jul. 9, 2020, the entire contents of which are incorporated herein by reference.

FIELD

Embodiments described herein relate generally to a film forming apparatus and a film forming method.

BACKGROUND

In the process of manufacturing a semiconductor device, in some cases, a film that generates a toxic gas is formed on a semiconductor substrate when the film contacts with the atmosphere. For example, when a film containing arsenic (As), selenium (Se), germanium (Ge), and silicon (Si) contacts with the atmosphere, the film reacts with hydrogen in the atmosphere, so that a toxic hydrogenated gas is generated.

For example, it is necessary to open the process chamber to the atmosphere at the time of maintenance of the film forming apparatus. In the case of the film forming apparatus that forms a film that generates a toxic gas when the film contacts with the atmosphere, it is necessary to suppress diffusion of the toxic gas from the film remaining in the process chamber to the external environment when the process chamber is opened to the atmosphere. For this reason, for example, maintenance of the film forming apparatus is performed in a room isolated from the external environment. Further, for example, it is necessary to protect a worker from a toxic gas at the time of maintenance of the film forming apparatus or at the time of unloading a semiconductor substrate from the film forming apparatus. For this reason, for example, the worker wears protective equipment to perform work.

DETAILED DESCRIPTION

Figure 1:
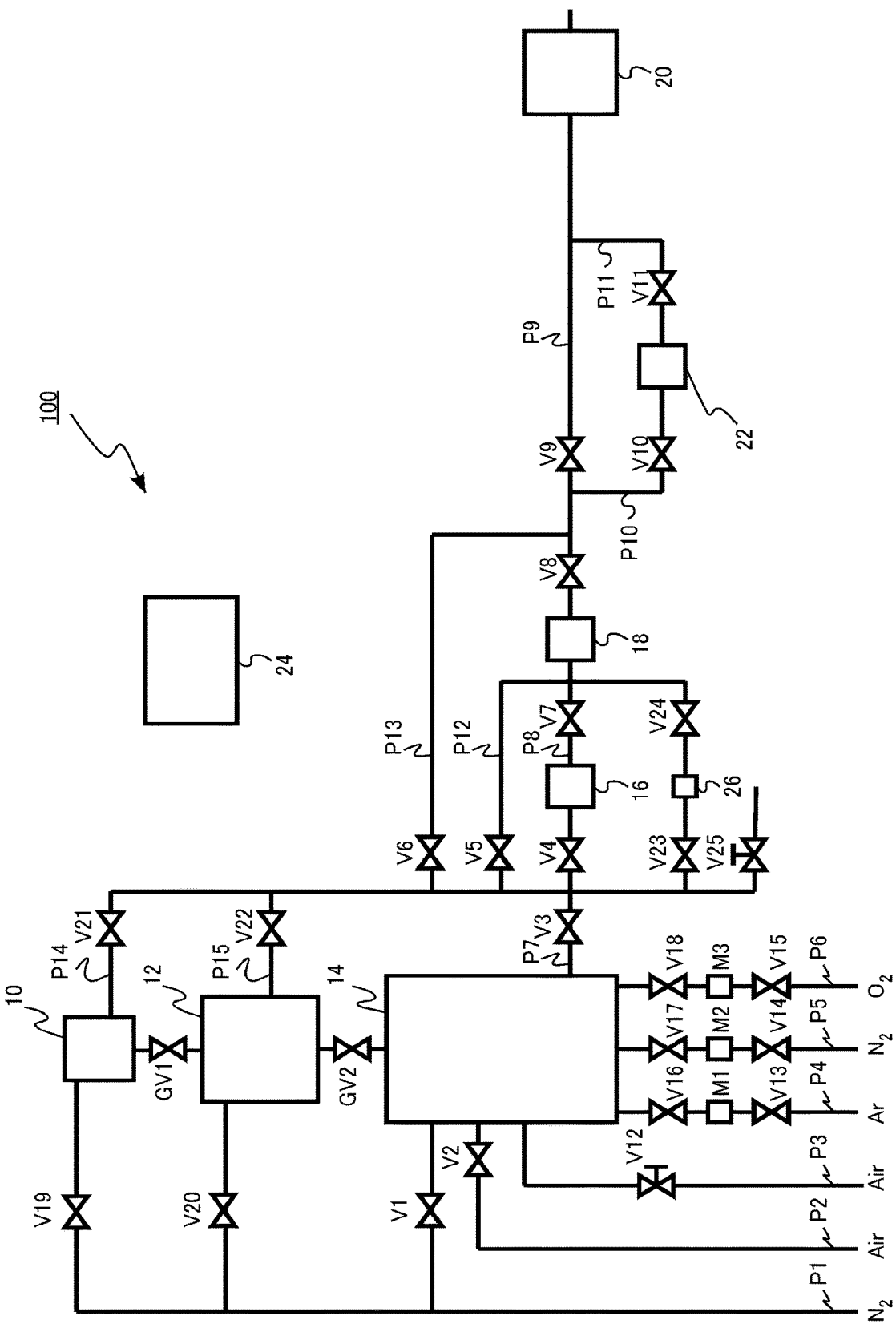
FIG. 1 is a schematic diagram of a film forming apparatus according to a first embodiment.

A film forming apparatus according to an embodiment includes: a process chamber forming a film on a substrate; an abatement device detoxifying a first exhaust gas exhausted from the process chamber; a first supply pipe supplying a gas containing water to the process chamber; a first vacuum pump provided in a first flow path of the first exhaust gas between the process chamber and the abatement device; a second vacuum pump provided in the first flow path between the first vacuum pump and the abatement device; and a first detector provided in the first flow path between the second vacuum pump and the abatement device, the first detector detecting a hydrogenated gas.

Hereinafter, embodiments are described with reference to the drawings. In the following description, the same or similar members are denoted by the same reference numerals, and the description of members and the like once described are to be appropriately omitted.

Hereinafter, film forming apparatuses and film forming methods according to the embodiments is described with reference to the drawings.

First Embodiment

A film forming apparatus according to a first embodiment includes: a process chamber forming a film on a substrate; an abatement device detoxifying a first exhaust gas exhausted from the process chamber; a first supply pipe supplying a gas containing water to the process chamber; a first vacuum pump provided in a first flow path of the first exhaust gas between the process chamber and the abatement device; a second vacuum pump provided in the first flow path between the first vacuum pump and the abatement device; and a first detector provided in the first flow path between the second vacuum pump and the abatement device, the first detector detecting a hydrogenated gas.

In addition, the film forming apparatus according to the first embodiment includes: a process chamber forming a film on a substrate, the process chamber configured to attach an abatement device detoxifying a first exhaust gas, a first vacuum pump provided in a first flow path including an exhaust pipe between the process chamber and the abatement device, a second vacuum pump provided in the first flow path between the first vacuum pump and the abatement device, and a first detector provided in the first flow path between the second vacuum pump and the abatement device and detecting a hydrogenated gas; a first supply pipe supplying a gas containing water to the process chamber; the exhaust pipe of the first exhaust gas exhausted from the process chamber; and a controller. The controller controls supply of the gas containing water to the process chamber, a flow of the first exhaust gas in the first flow path, and detection of the hydrogenated gas in the first detector, on the basis of a detection result of the hydrogenated gas in the first detector.

FIG. 1 is a schematic diagram of the film forming apparatus according to the first embodiment. FIG. 1 is a diagram illustrating a configuration of the film forming apparatus. The film forming apparatus according to the first embodiment is a sputtering apparatus 100 that forms a deposited film on a surface of a substrate such as a semiconductor wafer by using a sputtering method.

The sputtering apparatus 100 according to the first embodiment includes a load lock chamber 10, a transfer chamber 12, a process chamber 14, a turbomolecular pump 16, a dry pump 18, an abatement device 20, a first detector 22, a controller 24, and a quadrupole mass spectrometer 26. In addition, the sputtering apparatus 100 includes pipes P1 to P15, valves V1 to V29, gate valves GV1 and GV2, and mass flow controllers M1, M2, and M3. The turbomolecular pump 16 is an example of first vacuum pump. The dry pump 18 is an example of second vacuum pump.

A first flow path of a first exhaust gas exhausted from the process chamber 14 includes pipes P7, P8, P9, P10, P11, P12, and P13.

The pipe P2 is a first supply pipe for supplying a gas containing water ($H_2O$) to the process chamber 14. The pipe P1 is a second supply pipe for supplying a nitrogen gas to the process chamber 14. The pipe P4 is a third supply pipe for supplying an argon gas to the process chamber 14. The pipe P12 is a first bypass flow path for bypassing the turbomolecular pump 16. The pipe P13 is a second bypass flow path for bypassing the turbomolecular pump 16 and the dry pump 18.

The load lock chamber 10 has a function of loading or unloading a substrate into or from the process chamber 14. The pipe P1 for supplying the nitrogen gas to the load lock chamber 10 is connected to the load lock chamber 10. The nitrogen gas is a purge gas. The pipe P1 is an example of fourth supply pipe.

The transfer chamber 12 has a function of moving the substrate from the load lock chamber 10 to the process chamber 14 or moving the substrate from the process chamber 14 to the load lock chamber 10. The pipe P1 for supplying the nitrogen gas to the transfer chamber 12 is connected to the transfer chamber 12. The nitrogen gas is a purge gas.

The gate valve GV1 is provided between the load lock chamber 10 and the transfer chamber 12. The substrate is moved through the gate valve GV1.

The process chamber 14 has a function of forming a film on the substrate. The film is a deposited film. The gate valve GV2 is provided between the transfer chamber 12 and the process chamber 14. The substrate is moved through the gate valve GV2.

The pipe P2 for supplying the gas containing water is connected to the process chamber 14. The gas containing water is a purge gas. The gas containing water is, for example, the atmosphere. Hereinafter, a case where the gas containing water is the atmosphere is described as an example. The pipe P2 is an example of first supply pipe.

In this specification, "water" denotes a compound of oxygen and hydrogen. In this specification, "water" is a concept including liquid water and gaseous water vapor.

The pipe P3 for supplying the gas containing water is connected to the process chamber 14. The gas containing water is a purge gas. The gas containing water is, for example, the atmosphere. The pipe P3 includes a manual valve V12. The gas containing water can be manually supplied to the process chamber 14 by using the pipe P3.

The pipe P1 for supplying the nitrogen gas is connected to the process chamber 14. The nitrogen gas is a purge gas. The pipe P1 is an example of second supply pipe.

The pipe P4 for supplying the argon gas is connected to the process chamber 14. The argon gas is a sputtering gas. The pipe P4 is an example of third supply pipe.

The pipe P5 for supplying the nitrogen gas is connected to the process chamber 14. The nitrogen gas is, for example, a reactive gas used at the time of forming a nitride film.

The pipe P6 for supplying the oxygen gas is connected to the process chamber 14. The oxygen gas is, for example, a reactive gas used at the time of forming an oxide film. For example, the oxygen gas can also be used for oxidizing the target.

Figure 2:
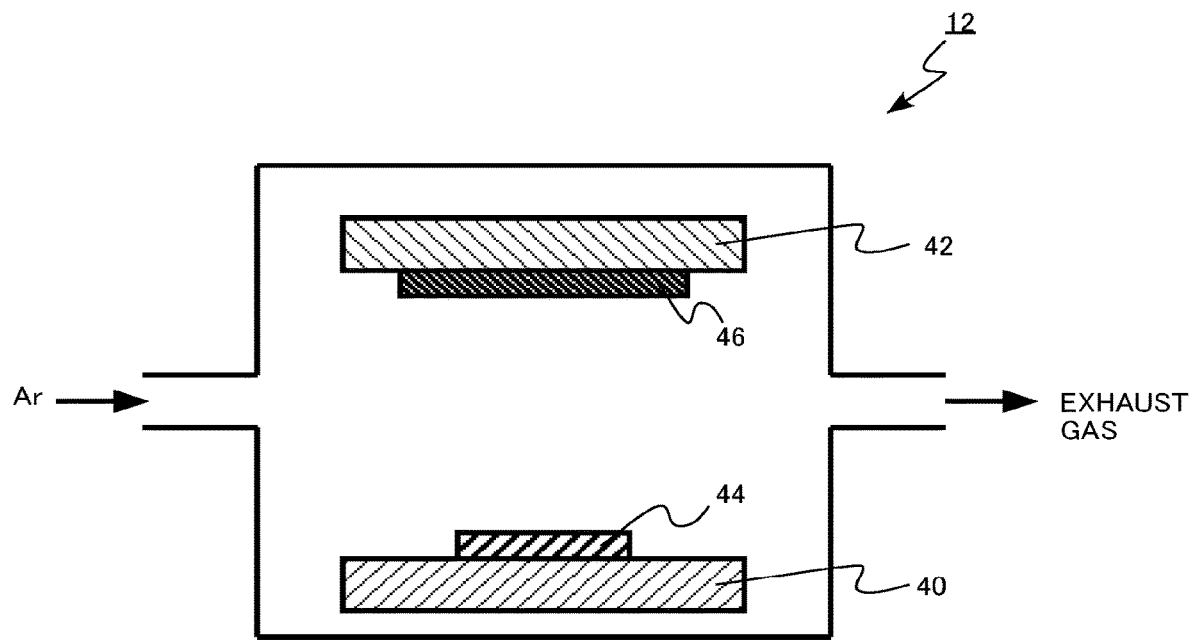
FIG. 2 is a schematic cross-sectional view of a process chamber according to the first embodiment.

FIG. 2 is a schematic cross-sectional view of the process chamber according to the first embodiment. The process chamber 14 has a substrate holder 40 and a target holder 42.

The substrate holder 40 holds a substrate 44. In addition, the target holder 42 holds a target 46 serving as a raw material of a film formed on the substrate 44. The target 46 is, for example, a quaternary mixed crystal of arsenic (As), selenium (Se), germanium (Ge), and silicon (Si).

At the time of forming a film on the substrate 44, for example, the argon gas is introduced into the process chamber 14 as a sputtering gas. The target 46 is sputtered by the argon gas, and a deposited film is formed on the substrate 44. The argon gas is discharged as exhaust gas.

The turbomolecular pump 16 is provided in the first flow path between the process chamber 14 and the abatement device 20. The turbomolecular pump 16 is provided between the pipe P7 and the pipe P8. The turbomolecular pump 16 has a function of bringing the process chamber 14 and the transfer chamber 12 into a high vacuum state. In some cases, for example, a cryopump can be used instead of the turbomolecular pump 16.

The dry pump 18 is provided in the first flow path between the turbomolecular pump 16 and the abatement device 20. The dry pump 18 is provided between the pipe P8 and the pipe P9. The dry pump 18 has a function of bringing the process chamber 14, the transfer chamber 12, and the load lock chamber 10 into a vacuum state.

The abatement device 20 has a function of detoxifying the first exhaust gas exhausted from the process chamber 14. The abatement device 20 is, for example, a dry abatement device. The abatement device 20 detoxifies the toxic hydrogenated gas contained in the first exhaust gas exhausted from, for example, the process chamber 14.

The first detector 22 is provided in the first flow path between the dry pump 18 and the abatement device 20. The first detector 22 is provided between the pipe P10 branched from the pipe P9 and the pipe P11. The pipe P11 is connected to the pipe P9.

Figure 3:
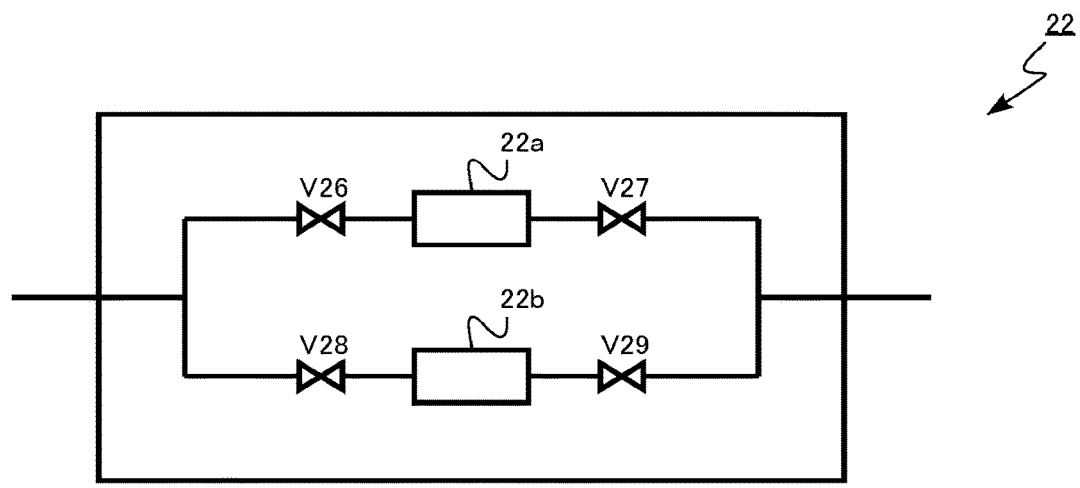
FIG. 3 is a schematic diagram illustrating details of a first detector according to the first embodiment.

FIG. 3 is a schematic diagram illustrating details of the first detector according to the first embodiment.

The first detector 22 can detect the hydrogenated gas. The hydrogenated gas is a gas of a hydride that is a compound containing hydrogen. The hydrogenated gas is, for example, arsine ($AsH_3$) or hydrogen selenide ($H_2Se$). The first detector 22 has a function of measuring the concentration of the hydrogenated gas contained in the first exhaust gas exhausted from the process chamber 14.

The first detector 22 has a first gas detector 22a and a second gas detector 22b. The first gas detector 22a can detect a first hydrogenated gas. In addition, the second gas detector 22b can detect a second hydrogenated gas different from the first hydrogenated gas. A chemical composition of the second hydrogenated gas is different from a chemical composition of the first hydrogenated gas. The first hydrogenated gas is, for example, arsine. The second hydrogenated gas is, for example, a hydrogen selenide.

The first detector 22 measures, for example, the concentration of the arsine contained in the first exhaust gas exhausted from the process chamber 14. In addition, the second gas detector 22*b* measures, for example, the concentration of the hydrogen selenide contained in the first exhaust gas exhausted from the process chamber 14.

In FIG. 3, the example in which the first gas detector 22*a* and the second gas detector 22*b* are connected in parallel is illustrated. The first gas detector 22*a* and the second gas detector 22*b* can also be connected in series.

The controller 24 has a function of controlling the supply of the gas containing water to the process chamber 14, the flow of the first exhaust gas in the first flow path, and the detection of the hydrogenated gas in the first detector 22, on the basis of a detection result of the hydrogenated gas in the first detector 22. The controller 24 controls, for example, the opening and closing of the valves V1 to V11, V13 to V24, and V26 to V29 and the operations of the turbomolecular pump 16 and the dry pump 18 on the basis of the detection result of the hydrogenated gas in the first detector 22.

The controller 24 stores, for example, a threshold concentration for determining whether the detection result of the hydrogenated gas in the first detector 22 is good or bad.

The controller 24 is, for example, hardware such as a circuit board. In addition, the controller 24 is, for example, a combination of hardware and software such as a control program stored in the memory. The controller 24 has, for example, a memory for storing the threshold concentration.

The controller 24, the valves V1 to V11, V13 to V24, and V26 to V29, the turbomolecular pump 16, the dry pump 18, and the first detector 22 are communicably connected to each other by using a wired or wireless communication function. The opening and closing of the valves V1 to V11, V13 to V24, and V26 to V29 are automatically controlled by the controller 24. The operations of the turbomolecular pump 16 and the dry pump 18 are automatically controlled by the controller 24.

The quadrupole mass spectrometer 26 is provided in parallel with the turbomolecular pump 16. The quadrupole mass spectrometer 26 has a function of analyzing elements contained in the first exhaust gas exhausted from the process chamber 14.

In addition, by opening the manual valve 25, the gas for analysis can be acquired from the process chamber 14.

Next, a method of opening the process chamber 14 of the sputtering apparatus 100 to the atmosphere is described. The process chamber 14 of the sputtering apparatus 100 needs to be, for example, regularly opened to the atmosphere for maintenance. Hereinafter, a method of opening the process chamber 14 to the atmosphere is described.

Figure 4:
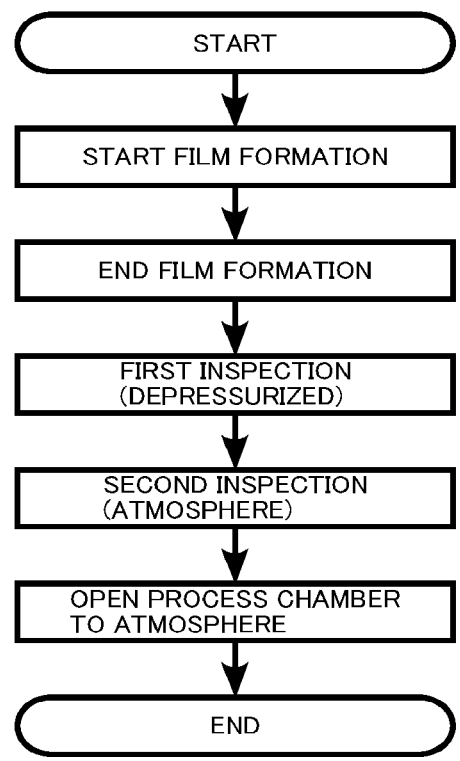
FIG. 4 is a flowchart of a method of opening the process chamber to the atmosphere in the film forming apparatus according to the first embodiment.
Figure 5:
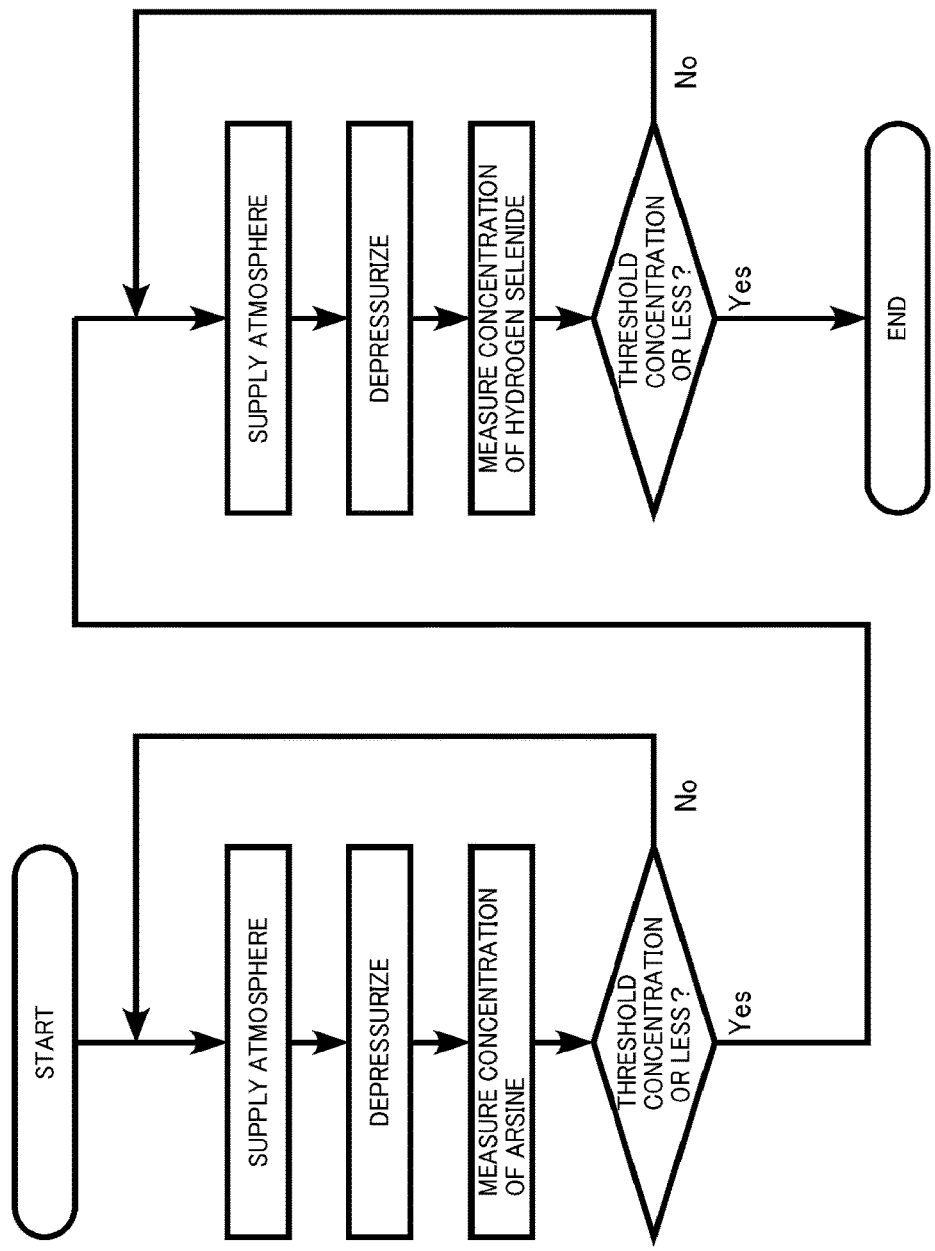
FIG. 5 is a flowchart of first inspection according to the first embodiment.
Figure 6:
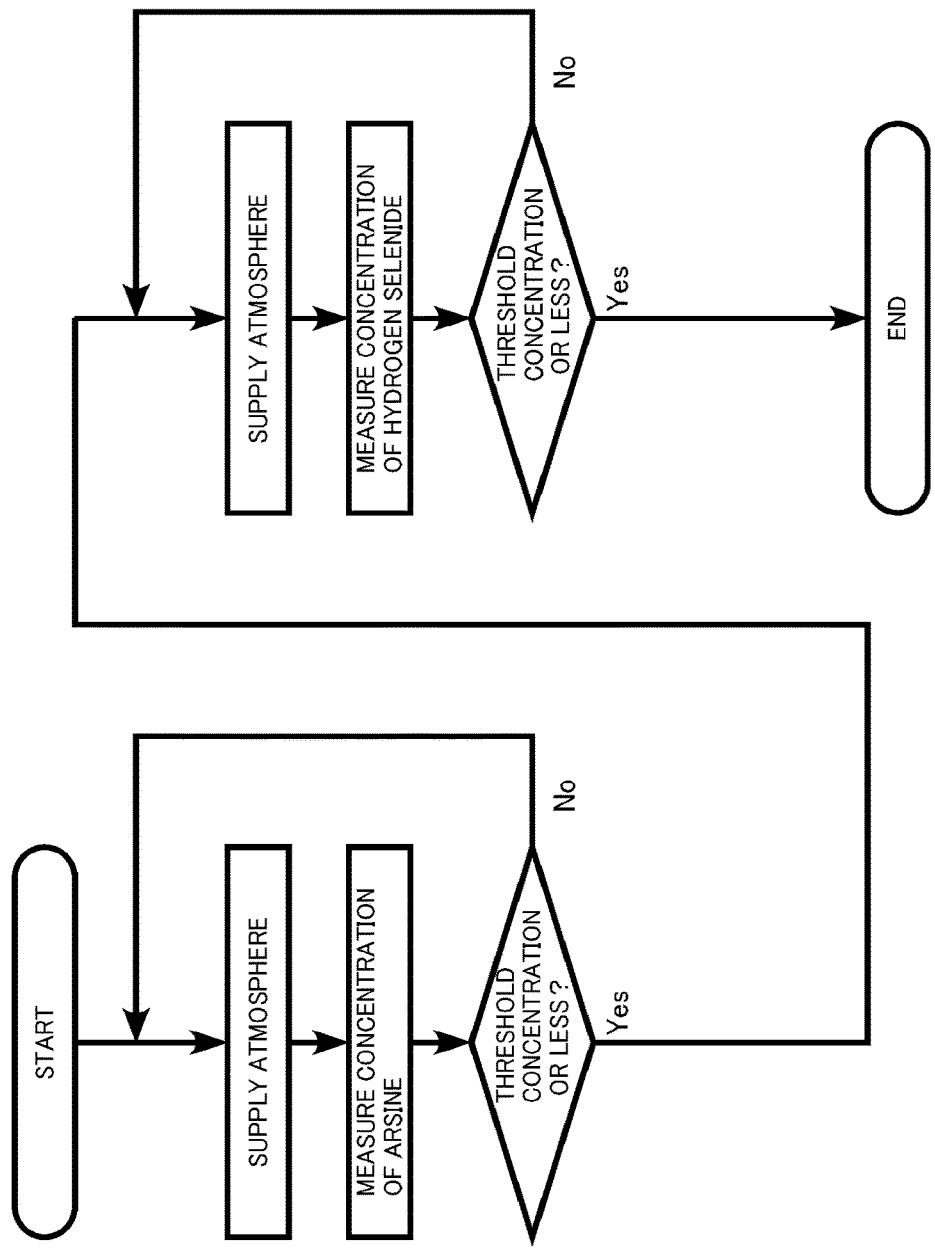
FIG. 6 is a flowchart of second inspection according to the first embodiment.

FIG. 4 is a flowchart of a method of opening the process chamber to the atmosphere in the film forming apparatus according to the first embodiment. FIG. 5 is a flowchart of first inspection according to the first embodiment. FIG. 6 is a flowchart of second inspection according to the first embodiment.

First, film formation is started. First, the substrate 44 is loaded into the load lock chamber 10. Next, the substrate 44 is moved from the load lock chamber 10 through the transfer chamber 12 to the process chamber 14. The substrate 44 is mounted on the substrate holder 40.

Next, a film is formed on the substrate 44 in the process chamber 14. The target 46 is held in the target holder 42 of the process chamber 14. The target 46 is, for example, a quaternary mixed crystal of arsenic (As), selenium (Se), germanium (Ge), and silicon (Si).

The argon gas is introduced as a sputtering gas into the process chamber 14 and thus, a film of a quaternary mixed crystal of arsenic (As), selenium (Se), germanium (Ge), and silicon (Si) is formed on the substrate 44.

Next, the substrate 44 is moved from the process chamber 14 through the transfer chamber 12 to the load lock chamber 10. The film formation is ended by unloading the substrate 44 from the load lock chamber 10.

After the end of the film formation, the first inspection is performed. FIG. 5 is a flowchart of the first inspection.

First, the atmosphere is supplied into the process chamber 14 from the pipe P2. In other words, an air with atmospheric pressure is supplied into the process chamber 14 from the pipe P2. Next, the inside of the process chamber 14 is depressurized down to a predetermined pressure by using, for example, the dry pump 18.

Next, the concentration of the arsine contained in the first exhaust gas exhausted from the process chamber 14 is measured by using the first gas detector 22*a* of the first detector 22.

Next, it is determined whether or not the measured concentration of the arsine is a predetermined threshold concentration or less. The determination is performed by the controller 24.

In a case where the measured concentration of the arsine is higher than the threshold concentration, the measurement of the concentration of the arsine is performed again from the atmosphere supply. The measurement of the concentration of the arsine from the atmosphere supply is repeated, for example, multiple times until the measured concentration of the arsine becomes a predetermined threshold concentration or less.

In a case where the measured concentration of the arsine is a predetermined threshold concentration or less, the process proceeds to the next measurement of the concentration of the hydrogen selenide. In addition, in order to further reduce, for example, the concentration of the arsine, the measurement of the concentration of the arsine may be added multiple times from the atmosphere supply after the concentration of the arsine becomes a predetermined threshold concentration or less.

Next, the atmosphere is supplied into the process chamber 14 from the pipe P2. Next, the inside of the process chamber 14 is depressurized down to a predetermined pressure by using, for example, the dry pump 18.

Next, the concentration of the hydrogen selenide contained in the first exhaust gas exhausted from the process chamber 14 is measured by using the second gas detector 22*b* of the first detector 22.

Next, it is determined whether or not the measured concentration of the hydrogen selenide is a predetermined threshold concentration or less. The determination is performed by the controller 24.

In a case where the measured concentration of the hydrogen selenide is higher than the threshold concentration, the measurement of the concentration of the hydrogen selenide is performed again from the atmosphere supply. The measurement of the concentration of the hydrogen selenide from the atmosphere supply is repeated, for example, multiple times until the measured concentration of the hydrogen selenide becomes a predetermined threshold concentration or less.

In a case where the measured concentration of the hydrogen selenide is a predetermined threshold concentration or less, the first inspection is ended. In addition, in order to further reduce, for example, the concentration of the hydrogen selenide, the measurement of the concentration of the hydrogen selenide may be added multiple times from the atmosphere supply after the concentration of the hydrogen selenide becomes a predetermined threshold concentration or less.

After the first inspection is ended, the second inspection is performed. FIG. 6 is a flowchart of the second inspection. The second inspection is different from the first inspection in that the second inspection is performed at an atmospheric pressure.

First, the atmosphere is supplied into the process chamber 14 from the pipe P2. By closing the valves V4 and V5 and opening the valve V6, the first exhaust gas exhausted from the process chamber 14 bypasses the turbomolecular pump 16 and the dry pump 18. The inside of the process chamber 14 becomes the atmospheric pressure.

Next, the concentration of the arsine contained in the first exhaust gas exhausted from the process chamber 14 is measured by using the first gas detector 22a of the first detector 22.

Next, it is determined whether or not the measured concentration of the arsine is a predetermined threshold concentration or less. The determination is performed by the controller 24.

In a case where the measured concentration of the arsine is higher than the threshold concentration, the measurement of the concentration of the arsine is performed again from the atmosphere supply. The measurement of the concentration of the arsine from the atmosphere supply is repeated, for example, multiple times until the measured concentration of the arsine becomes a predetermined threshold concentration or less.

In a case where the measured concentration of the arsine is a predetermined threshold concentration or less, the process proceeds to the next measurement of the concentration of the hydrogen selenide. In addition, in order to further reduce, for example, the concentration of the arsine, the measurement of the concentration of the arsine may be added multiple times from the atmosphere supply after the concentration of the arsine becomes a predetermined threshold concentration or less.

Next, the atmosphere is supplied into the process chamber 14 from the pipe P2.

Next, the concentration of the hydrogen selenide contained in the first exhaust gas exhausted from the process chamber 14 is measured by using the second gas detector 22b of the first detector 22.

Next, it is determined whether or not the measured concentration of the hydrogen selenide is a predetermined threshold concentration or less. The determination is performed by the controller 24.

In a case where the measured concentration of the hydrogen selenide is higher than the threshold concentration, the measurement of the concentration of the hydrogen selenide is performed again from the atmosphere supply. The measurement of the concentration of the hydrogen selenide from the atmosphere supply is repeated, for example, multiple times until the measured concentration of the hydrogen selenide becomes a predetermined threshold concentration or less.

In a case where the measured concentration of the hydrogen selenide is a predetermined threshold concentration or less, the second inspection is ended. In addition, in order to further reduce, for example, the concentration of the hydrogen selenide, the measurement of the concentration of the hydrogen selenide may be added multiple times from the atmosphere supply after the concentration of the hydrogen selenide becomes a predetermined threshold concentration or less.

After the second inspection is ended, the opening of the process chamber 14 to the atmosphere is performed.

In addition, in the first inspection, the controller 24 perform the inspection by automatically controlling the opening and closing of the valves V1 to V11, V13 to V24, and V26 to V29, and the operations of the turbomolecular pump 16 and the dry pump 18 on the basis of the measurement result of the first gas detector 22a or the second gas detector 22b. In addition, in the second inspection, the controller 24 perform the inspection by automatically controlling the opening and closing of the valves V1 to V11, V13 to V24, and V26 to V29, and the operations of the turbomolecular pump 16 and the dry pump 18 on the basis of the measurement result of the first gas detector 22a or the second gas detector 22b.

The supply of the atmosphere to the process chamber 14 and the flow of the first exhaust gas exhausted from the process chamber 14 in the first flow path are automatically controlled by the controller 24.

In addition, after the end of the film formation and before the first inspection, the surface of the target 46 may be oxidized by supplying oxygen into the process chamber 14 from the pipe P6. It is possible to suppress the amount of hydrogenated gas generated from the target 46.

Next, the function and effect of the film forming apparatus according to the first embodiment are described.

In the process of manufacturing a semiconductor device, in some cases, a film that generates a toxic gas when the film contacts with the atmosphere may be formed on a semiconductor substrate. For example, a film containing arsenic (As), selenium (Se), germanium (Ge), and silicon (Si) reacts with hydrogen in the atmosphere to generate a toxic hydrogenated gas when the film contacts with the atmosphere.

For example, it is necessary to open the process chamber to the atmosphere at the time of maintenance of the film forming apparatus. In the case of the film forming apparatus that forms a film that generates a toxic gas when the film contacts with the atmosphere, it is necessary to suppress the diffusion of the toxic gas from the film remaining in the process chamber to the external environment when the process chamber is opened to the atmosphere. For this reason, for example, maintenance of the film forming apparatus is performed in a room isolated from the external environment. Further, for example, in order to protect the worker from toxic gas, the worker wears protective equipment to perform work.

In order to avoid environmental pollution and protect the health of workers, it is preferable to suppress the diffusion of the hydrogenated gas to the outside of the apparatus when the process chamber is opened to the atmosphere.

Figure 7:
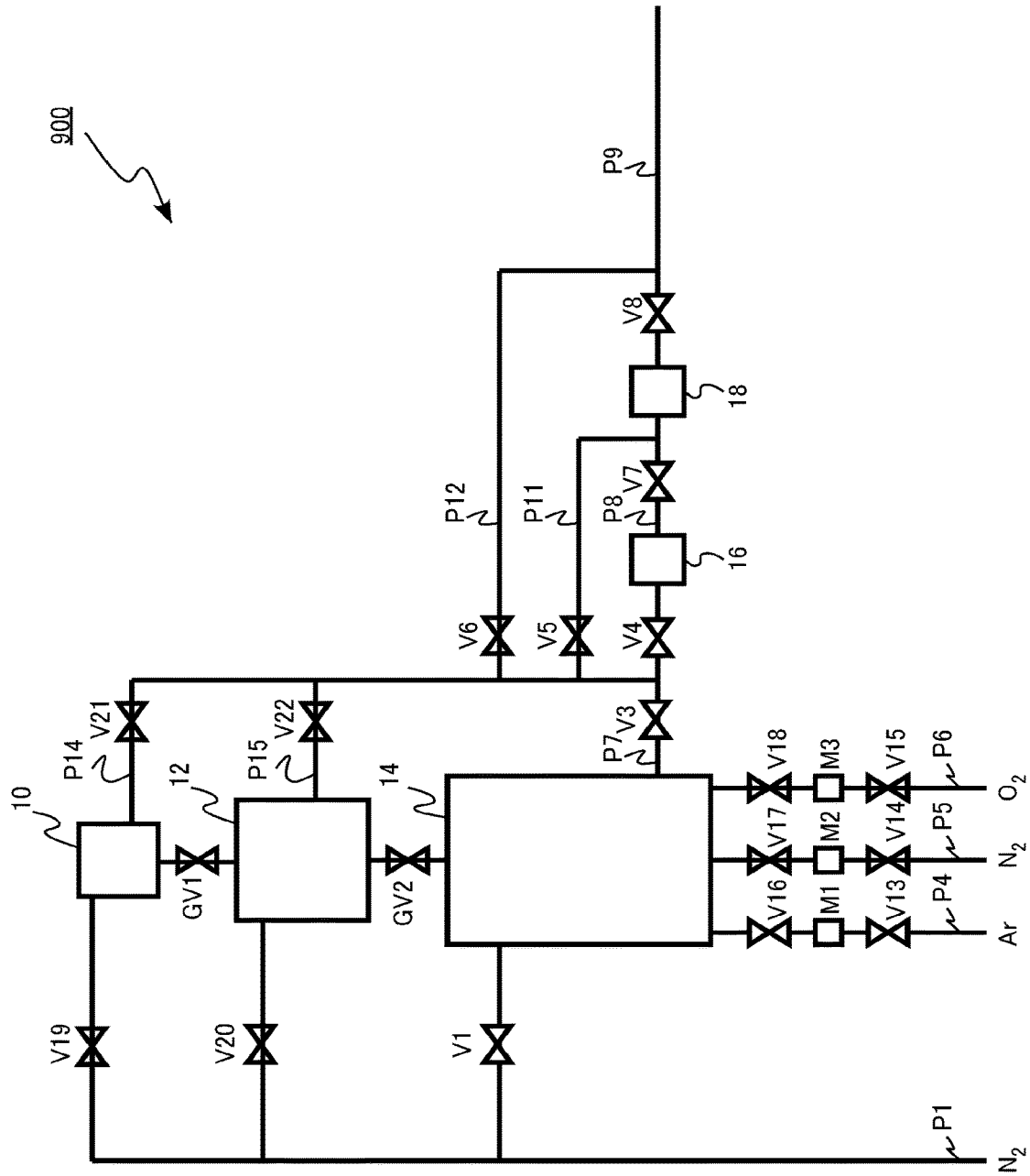
FIG. 7 is a schematic diagram of a film forming apparatus according to a comparative example.

FIG. 7 is a schematic diagram of a film forming apparatus according to a comparative example. The film forming apparatus according to comparative example is a sputtering apparatus 900 that forms a deposited film on a surface of a substrate such as a semiconductor wafer by using a sputtering method.

The sputtering apparatus 900 is different from the sputtering apparatus 100 according to the first embodiment in that the sputtering apparatus does not include the pipe P2 for supplying the gas containing water to the process chamber 14, the abatement device 20, and the first detector 22.

For example, considered is a case where a film containing arsenic (As), selenium (Se), germanium (Ge), and silicon (Si) is formed on the substrate 44 by using the sputtering apparatus 900. After the end of the film formation, in the process chamber 14, a target 46 of a quaternary mixed crystal of arsenic (As), selenium (Se), germanium (Ge), and silicon (Si) is held in the target holder 42.

When the surface of the target 46 is exposed to the atmosphere by opening the process chamber 14 to the atmosphere, due to the reaction with hydrogen in the atmosphere, arsine and hydrogen selenide that are toxic are generated. Therefore, the toxic hydrogenated gas diffuses to the outside of the sputtering apparatus 900.

The sputtering apparatus 100 according to the first embodiment includes a pipe P2 for supplying the atmosphere to the process chamber 14, an abatement device 20, and a first detector 22.

In the sputtering apparatus 100, the atmosphere can be supplied into the process chamber 14 before the process chamber 14 is opened to the atmosphere. Therefore, it is possible to generate the hydrogenated gas in the process chamber 14 in advance.

The hydrogenated gas in the first exhaust gas exhausted from the process chamber 14 is toxicity-abated by the abatement device 20 and is released to the outside of the sputtering apparatus 100. Therefore, the diffusion of the toxic hydrogenated gas to the outside of the sputtering apparatus 100 is suppressed.

Then, the atmosphere supply into the process chamber 14 and the measurement of the concentration of the hydrogenated gas in the first exhaust gas are repeatedly performed. Since the hydrogenation reaction on the surface of the target 46 is gradually suppressed, the atmosphere supply and the measurement of the concentration of the hydrogenated gas are repeated until the concentration of the hydrogenated gas becomes a safe predetermined threshold concentration or less. After the concentration of the hydrogenated gas becomes a safe predetermined threshold concentration or less, the process chamber 14 is opened to the atmosphere.

When the process chamber 14 is opened to the atmosphere, since the hydrogenation reaction has not already occurred on the surface of the target 46, the diffusion of the toxic hydrogenated gas to the outside of the sputtering apparatus 100 is suppressed.

The pipe P1 for supplying the nitrogen gas is preferably connected to the process chamber 14. For example, in the case of forming a film that does not generate the toxic hydrogenated gas on the substrate 44, the nitrogen gas can be used as a purge gas.

The pipe P6 for supplying the oxygen gas is preferably connected to the process chamber 14. For example, after the end of the film formation and before the first inspection, by supplying oxygen from the pipe P6 into the process chamber 14, the surface of the target 46 can be oxidized. By oxidizing the surface of the target 46, it is possible to suppress the amount of hydrogenated gas generated from the target 46.

From the viewpoint of surely suppressing the diffusion of the toxic hydrogenated gas to the outside of the sputtering apparatus 100, it is preferable to perform the inspection in two stages of the first inspection at a low pressure and the second inspection at the atmospheric pressure. For example, there is a concern that, if only the second inspection is performed at the atmospheric pressure, the hydrogenated gas exceeding the detoxifying ability of the abatement device 20 may be generated, and the toxic hydrogenated gas may diffuse to the outside of the sputtering apparatus 100. Further, there is a concern that, for example, if only the first inspection at a low pressure is performed, when the process chamber 14 is opened to the atmosphere, a large amount of hydrogenated gas may be generated, and the toxic hydrogenated gas may diffuse to the outside of the sputtering apparatus 100.

As described above, according to the first embodiment, it is possible to suppress the diffusion of the hydrogenated gas to the outside of the apparatus.

Second Embodiment

A film forming apparatus according to a second embodiment is different from the film forming apparatus according to the first embodiment in that the film forming apparatus further includes a fourth supply pipe supplying the gas containing water to the load lock chamber. Hereinafter, a portion of the description of contents overlapping with that of the first embodiment will be omitted.

Figure 8:
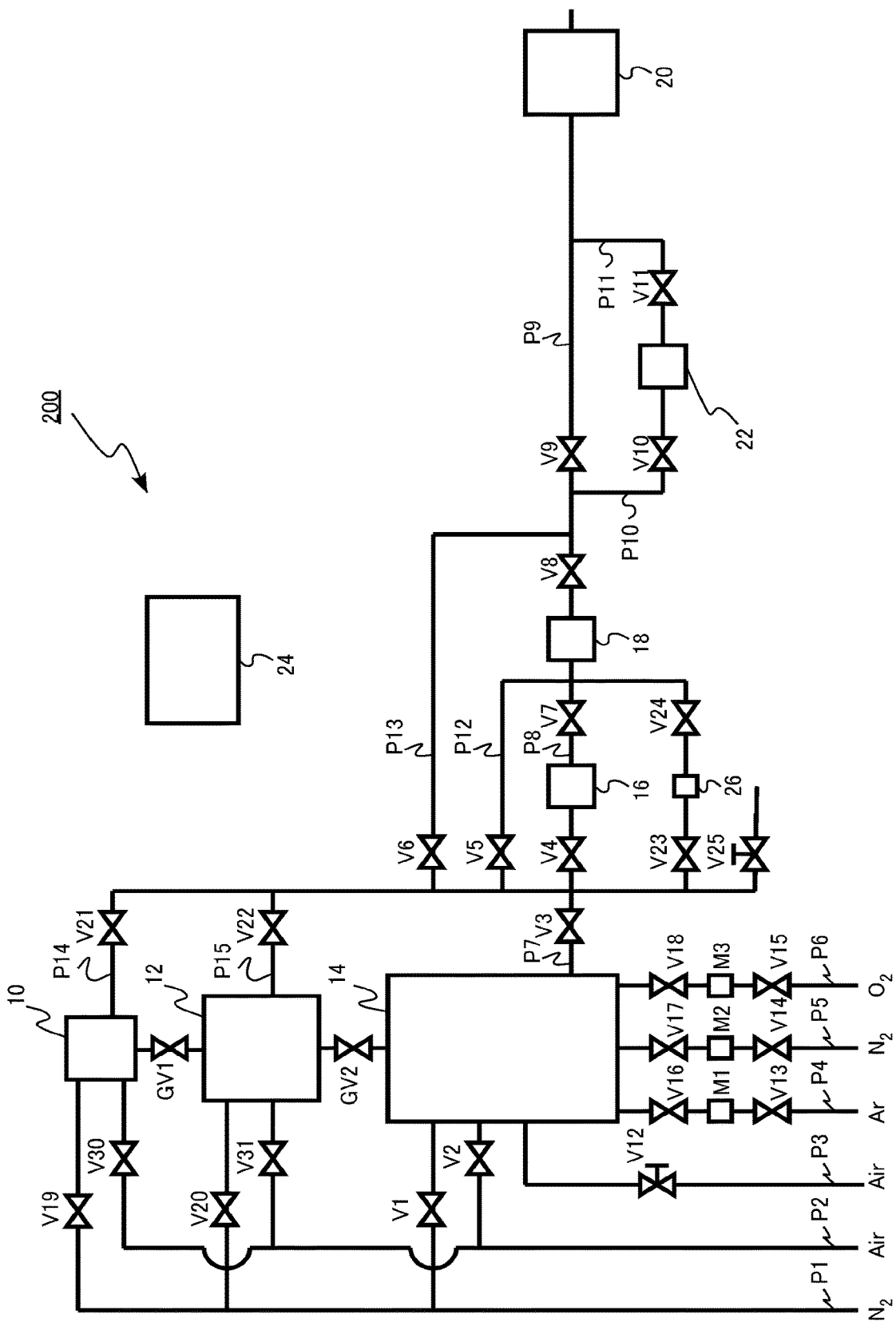
FIG. 8 is a schematic diagram of a film forming apparatus according to a second embodiment.

FIG. 8 is a schematic diagram of the film forming apparatus according to the second embodiment. FIG. 8 is a diagram illustrating a configuration of the film forming apparatus. The film forming apparatus according to the second embodiment is a sputtering apparatus 200 that forms a deposited film on a surface of a substrate such as a semiconductor wafer by using a sputtering method.

The sputtering apparatus 200 according to the second embodiment includes a load lock chamber 10, a transfer chamber 12, a process chamber 14, a turbomolecular pump 16, a dry pump 18, and an abatement device 20, a first detector 22, a controller 24, and a quadrupole mass spectrometer 26. In addition, the sputtering apparatus 200 includes pipes P1 to P15, valves V1 to V31, gate valves GV1 and GV2, and mass flow controllers M1, M2, and M3. The turbomolecular pump 16 is an example of first vacuum pump. The dry pump 18 is an example of second vacuum pump.

The first flow path of the first exhaust gas exhausted from the process chamber 14 includes pipes P7, P8, P9, P10, P11, P12, and P13. The third flow path of the third exhaust gas exhausted from the load lock chamber 10 includes pipes P14, P7, P8, P9, P10, P11, P12 and P13.

The pipe P2 is a first supply pipe for supplying the gas containing water to the process chamber 14. The pipe P2 is a fourth supply pipe for supplying the gas containing water to the load lock chamber 10.

In the configuration of FIG. 8, the same pipe P2 is used for the first supply pipe for supplying the gas containing water to the process chamber and the fourth supply pipe for supplying the gas containing water for the load lock chamber 10, but separate and independent pipes may also be configured to be used for the first supply pipe and the fourth supply pipe.

In addition, the pipe P2 supplies the gas containing water to the transfer chamber 12.

The pipe P1 is a second supply pipe for supplying the nitrogen gas to the process chamber. The pipe P1 is a fifth supply pipe for supplying the nitrogen gas to the load lock chamber 10.

In the configuration of FIG. 8, the same pipe P1 is used for the second supply pipe for supplying the nitrogen gas to the process chamber and the fifth supply pipe for supplying the nitrogen gas to the load lock chamber 10, but separate and independent pipes may also be configured to be used for the second supply pipe and the fifth supply pipe.

In addition, the pipe P1 supplies the nitrogen gas to the transfer chamber 12.

The pipe P4 is a third supply pipe for supplying the argon gas to the process chamber. The pipe P12 is a first bypass flow path for bypassing the turbomolecular pump 16. The pipe P13 is a second bypass flow path for bypassing the turbomolecular pump 16 and the dry pump 18.

Next, a film forming method according to the second embodiment is described.

The film forming method according to the second embodiment includes: loading a substrate into a load lock chamber of a film forming apparatus; reducing a pressure in the load lock chamber; moving the substrate from the load lock chamber to a process chamber; forming a film on the substrate in the process chamber; moving the substrate from the process chamber to the load lock chamber; supplying a gas containing water into the load lock chamber, performing a first inspection measuring a first concentration of a hydrogenated gas in an exhaust gas exhausted from the load lock chamber in a state where a pressure in the load lock chamber is a first pressure; and unloading the substrate to an outside of the load lock chamber after the first concentration becomes a predetermined threshold concentration or less in the first inspection.

Figure 9:
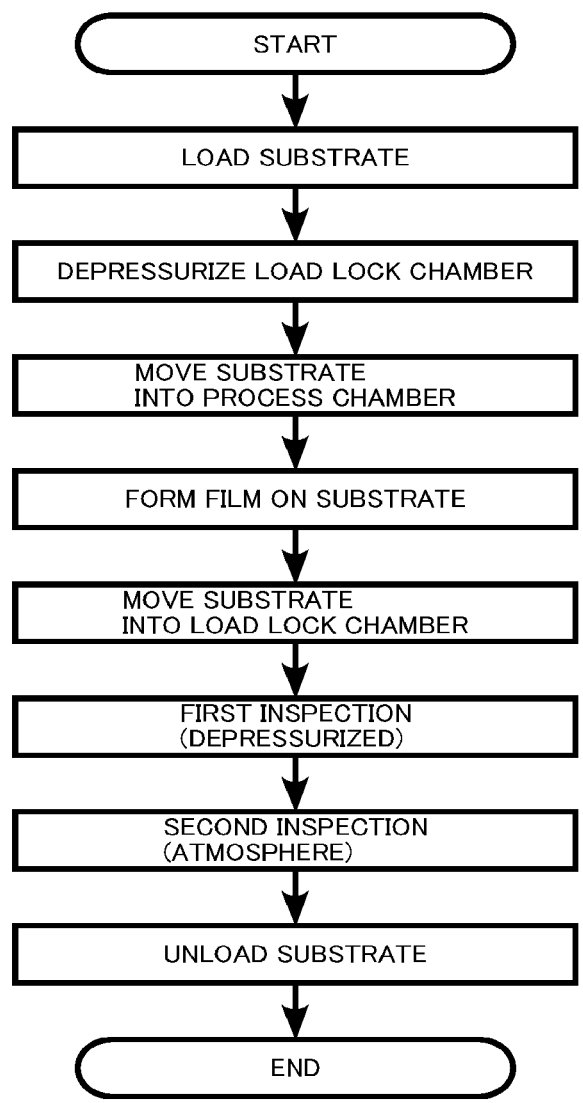
FIG. 9 is a flowchart of a film forming method according to the second embodiment.

FIG. 9 is a flowchart of the film forming method according to the second embodiment.

First, the substrate 44 is loaded into the load lock chamber 10. Next, the inside of the load lock chamber 10 is depressurized down to a predetermined pressure by using, for example, the dry pump 18.

Next, the substrate 44 is moved from the load lock chamber 10 through the transfer chamber 12 to the process chamber 14. The substrate 44 is mounted on the substrate holder 40.

Next, a film is formed on the substrate 44 in the process chamber 14. The target 46 is held in the target holder 42 of the process chamber 14. The target 46 is, for example, a quaternary mixed crystal of arsenic (As), selenium (Se), germanium (Ge), and silicon (Si).

The argon gas is introduced as a sputtering gas into the process chamber 14, and thus, a film of a quaternary mixed crystal of arsenic (As), selenium (Se), germanium (Ge), and silicon (Si) is formed on the substrate 44. The film contains arsenic (As), selenium (Se), germanium (Ge), and silicon (Si).

Next, the substrate 44 is moved from the process chamber 14 through the transfer chamber 12 to the load lock chamber 10.

After the substrate 44 is moved to the load lock chamber 10, the first inspection is performed. The first inspection is similar to that of the first embodiment. Hereinafter, description will be made with reference to the flowchart of the first inspection in FIG. 5.

First, the atmosphere is supplied into the load lock chamber 10 from the pipe P2. Next, the inside of the load lock chamber 10 is depressurized down to a predetermined pressure by using, for example, the dry pump 18. The predetermined pressure is an example of first pressure.

Next, the concentration of the arsine contained in the third exhaust gas exhausted from the load lock chamber 10 is measured by using the first gas detector 22a of the first detector 22.

Next, it is determined whether or not the measured concentration of the arsine is a predetermined threshold concentration or less. The determination is performed by the controller 24.

In a case where the measured concentration of the arsine is higher than the threshold concentration, the measurement of the concentration of the arsine is performed again from the atmosphere supply. The measurement of the concentration of the arsine from the atmosphere supply is repeated, for example, multiple times until the measured concentration of the arsine becomes a predetermined threshold concentration or less.

In a case where the measured concentration of the arsine is a predetermined threshold concentration or less, the process proceeds to the next measurement of the concentration of the hydrogen selenide. In addition, in order to further reduce, for example, the concentration of the arsine, the measurement of the concentration of the arsine may be added multiple times from the atmosphere supply after the concentration of the arsine becomes a predetermined threshold concentration or less.

Next, the atmosphere is supplied into the load lock chamber 10 from the pipe P2. Next, the inside of the load lock chamber 10 is depressurized down to a predetermined pressure by using, for example, the dry pump 18.

Next, the concentration of the hydrogen selenide contained in the third exhaust gas exhausted from the load lock chamber 10 is measured by using the second gas detector 22b of the first detector 22.

Next, it is determined whether or not the measured concentration of the hydrogen selenide is a predetermined threshold concentration or less. The determination is performed by the controller 24.

In a case where the measured concentration of the hydrogen selenide is higher than the threshold concentration, the measurement of the concentration of the hydrogen selenide is performed again from the atmosphere supply. The measurement of the concentration of the hydrogen selenide from the atmosphere supply is repeated, for example, multiple times until the measured concentration of the hydrogen selenide becomes a predetermined threshold concentration or less.

In a case where the measured concentration of the hydrogen selenide is the predetermined threshold concentration or less, the first inspection is ended. In addition, in order to further reduce, for example, the concentration of the hydrogen selenide, after the concentration of the hydrogen selenide becomes a predetermined threshold concentration or less, the measurement of the concentration of the hydrogen selenide from the atmosphere supply may be added multiple times.

After the first inspection is ended, the second inspection is performed. The second inspection is similar to that of the first embodiment. Hereinafter, description will be made with reference to the flowchart of the second inspection in FIG. 6. The second inspection is different from the first inspection in that the second inspection is performed at an atmospheric pressure higher than the first pressure. The atmospheric pressure is an example of second pressure.

First, the atmosphere is supplied into the load lock chamber 10 from the pipe P2. By closing the valves V4 and V5 and opening the valve V6, the third exhaust gas exhausted from the load lock chamber 10 bypasses the turbomolecular pump 16 and the dry pump 18. The inside of the load lock chamber 10 is at the atmospheric pressure.

Next, the concentration of the arsine contained in the third exhaust gas exhausted from the load lock chamber 10 is measured by using the first gas detector 22a of the first detector 22.

Next, it is determined whether or not the measured concentration of the arsine is a predetermined threshold concentration or less. The determination is performed by the controller 24.

In a case where the measured concentration of the arsine is higher than the threshold concentration, the measurement of the concentration of the arsine is performed again from the atmosphere supply. The measurement of the concentration of the arsine from the atmosphere supply is repeated, for example, multiple times until the measured concentration of the arsine becomes a predetermined threshold concentration or less.

In a case where the measured concentration of the arsine is a predetermined threshold concentration or less, the process proceeds to the next measurement of the concentration of the hydrogen selenide. In addition, in order to further reduce, for example, the concentration of the arsine, the measurement of the concentration of the arsine may be added multiple times from the atmosphere supply after the concentration of the arsine becomes a predetermined threshold concentration or less.

Next, the atmosphere is supplied into the load lock chamber 10 from the pipe P2. The inside of the load lock chamber 10 is at the atmospheric pressure.

Next, the concentration of the hydrogen selenide contained in the third exhaust gas exhausted from the load lock chamber 10 is measured by using the second gas detector 22b of the first detector 22.

Next, it is determined whether or not the measured concentration of the hydrogen selenide is a predetermined threshold concentration or less. The determination is performed by the controller 24.

In a case where the measured concentration of the hydrogen selenide is higher than the threshold concentration, the measurement of the concentration of the hydrogen selenide is performed again from the atmosphere supply. The measurement of the concentration of the hydrogen selenide from the atmosphere supply is repeated, for example, multiple times until the measured concentration of the hydrogen selenide becomes a predetermined threshold concentration or less.

In a case where the measured concentration of the hydrogen selenide is a predetermined threshold concentration or less, the second inspection is ended. In addition, in order to further reduce, for example, the concentration of the hydrogen selenide, the measurement of the concentration of the hydrogen selenide may be added multiple times from the atmosphere supply after the concentration of the hydrogen selenide becomes a predetermined threshold concentration or less.

After the second inspection is ended, the opening of the load lock chamber 10 to the atmosphere is performed, and the substrate 44 is unloaded to the outside from the load lock chamber 10.

Furthermore, in the first inspection, the controller 24 performs the inspection by automatically controlling the opening and closing of the valves V1 to V11, V13 to V24, and V26 to V29 and the operations of the turbomolecular pump 16 and the dry pump 18 on the basis of the measurement result of the first gas detector 22a or the second gas detector 22b. In addition, in the second inspection, the controller 24 performs the inspection by automatically controlling the opening and closing of the valves V1 to V11, V13 to V24, and V26 to V29 and the operations of the turbomolecular pump 16 and the dry pump 18 on the basis of the measurement result of the first gas detector 22a or the second gas detector 22b.

The supply of the gas containing water to the load lock chamber 10 and the flow of the third exhaust gas exhausted from the load lock chamber 10 in the third flow path are automatically controlled by the controller 24.

Next, the function and effect of the film forming apparatus according to the second embodiment is described.

For example, in a case where a film containing arsenic (As), selenium (Se), germanium (Ge), and silicon (Si) is formed on the substrate 44, when the substrate 44 is unloaded from the load lock chamber 10, arsine and hydrogen selenide that are toxic are generated. That is, when the substrate 44 is exposed to the atmosphere, hydrogen in the atmosphere reacts with the surface of the substrate 44, so that arsine and hydrogen selenide that are toxic are generated.

The sputtering apparatus 200 according to the second embodiment includes a pipe P2 (fourth supply pipe) for supplying the gas containing water to the load lock chamber 10, an abatement device 20, and a first detector 22. The pipe P2 is an example of fourth supply pipe.

In the sputtering apparatus 200, the atmosphere can be supplied into the load lock chamber 10 before the opening of the load lock chamber 10 to the atmosphere. For this reason, it is possible to generate the hydrogenated gas in the load lock chamber 10 in advance.

The hydrogenated gas in the third exhaust gas exhausted from the load lock chamber 10 is toxicity-abated by the abatement device 20 and is released to the outside of the sputtering apparatus 200. Therefore, diffusion of the toxic hydrogenated gas to the outside of the sputtering apparatus 200 is suppressed.

Then, the atmosphere supply into the load lock chamber 10 and the measurement of the concentration of the hydrogenated gas in the third exhaust gas are repeatedly performed. Since the hydrogenation reaction on the surface of the substrate 44 is gradually suppressed, the atmosphere supply and the measurement of the concentration of the hydrogenated gas are repeated until the hydrogenated gas concentration becomes a safe predetermined threshold value or less. After the concentration of the hydrogenated gas becomes a safe predetermined threshold value or less, the load lock chamber 10 is opened to the atmosphere.

When the load lock chamber 10 is opened to the atmosphere, since the hydrogenation reaction does not already occur on the surface of the target 46, the diffusion of the toxic hydrogenated gas to the outside of the sputtering apparatus 200 is suppressed.

The pipe P1 for supplying the nitrogen gas is preferably connected to the load lock chamber 10. For example, in the case of forming a film that does not generate a toxic hydrogenated gas on the substrate 44, the nitrogen gas can be used as a purge gas. The pipe P1 is an example of fifth supply pipe.

From the viewpoint of reliably suppressing the diffusion of the toxic hydrogenated gas to the outside of the sputtering apparatus 200, it is preferable to perform the inspection in two stages of the first inspection at a low pressure and the second inspection at the atmospheric pressure. For example, there is a concern that, if only the second inspection is performed at the atmospheric pressure, the hydrogenated gas exceeding the detoxifying ability of the abatement device 20 may be generated, and the toxic hydrogenated gas may diffuse to the outside of the sputtering apparatus 200. Further, there is a concern that, for example, if only the first inspection at a low pressure is performed, when the load lock chamber 10 is opened to the atmosphere, a large amount of hydrogenated gas is generated, and the toxic hydrogenated gas may diffuse to the outside of the sputtering apparatus 200.

As described above, according to the second embodiment, it is possible to suppress the diffusion of the hydrogenated gas to the outside of the apparatus.

Third Embodiment

A film forming method according to a third embodiment is different from the atmosphere opening method according to the first embodiment in that, after the end of the film formation, the measurement of the concentration of the hydrogenated gas is performed without supplying the gas containing water to the process chamber. Hereinafter, a portion of the description of contents overlapping with that of the first embodiment will be omitted.

The film forming method according to the third embodiment is a film forming method using the sputtering apparatus 100 according to the first embodiment.

Figure 10:
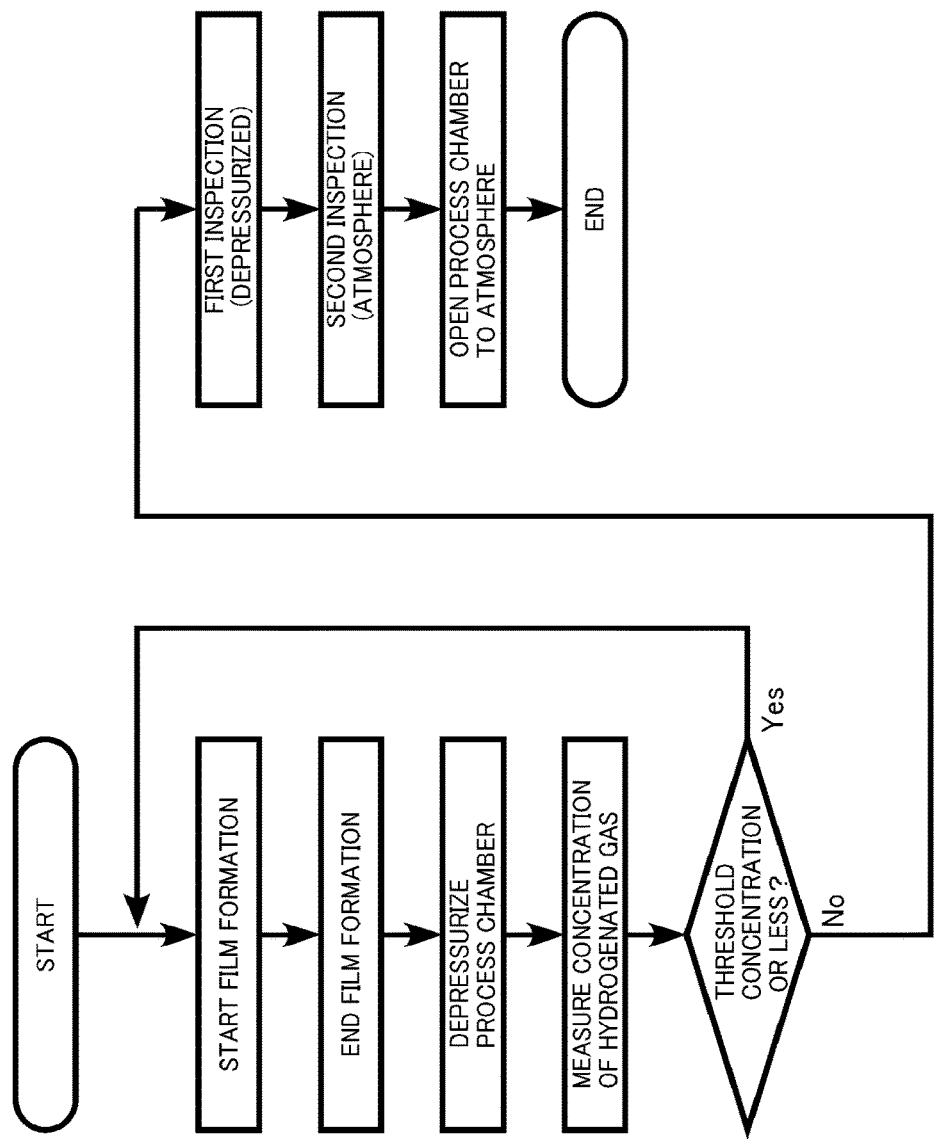
FIG. 10 is a flowchart of a film forming method according to a third embodiment.

FIG. 10 is a flowchart of the film forming method according to the third embodiment.

First, film formation is started. First, a first substrate is loaded into the load lock chamber 10. Next, the first substrate is moved from the load lock chamber 10 through the transfer chamber 12 to the process chamber 14. The first substrate is mounted on the substrate holder 40.

Next, in the process chamber 14, a film is formed on the first substrate. The target 46 is held in the target holder 42 of the process chamber 14. The target 46 is, for example, a quaternary mixed crystal of arsenic (As), selenium (Se), germanium (Ge), and silicon (Si).

The argon gas is introduced as a sputtering gas into the process chamber 14, and a film of a quaternary mixed crystal of arsenic (As), selenium (Se), germanium (Ge), and silicon (Si) is formed on the first substrate.

Next, the first substrate is moved from the process chamber 14 through the transfer chamber 12 to the load lock chamber 10. The film formation is ended by unloading the first substrate from the load lock chamber 10.

After the end of the film formation, the process chamber 14 is depressurized down to a predetermined pressure. For example, the inside of the process chamber 14 is depressurized down to a predetermined pressure by using the dry pump 18 and the turbomolecular pump 16.

Next, the measurement of the hydrogenated gas concentration is performed. The measurement of the hydrogenated gas concentration is performed by using the first detector 22.

The concentration of the arsine contained in the first exhaust gas exhausted from the process chamber 14 is measured by using the first gas detector 22a of the first detector 22.

Next, it is determined whether or not the measured concentration of the arsine is a predetermined threshold concentration or less. The determination is performed by the controller 24.

Next, the concentration of the hydrogen selenide contained in the first exhaust gas exhausted from the process chamber 14 is measured by using the second gas detector 22b of the first detector 22.

Next, it is determined whether or not the measured concentration of the hydrogen selenide is a predetermined threshold concentration or less. The determination is performed by the controller 24.

In a case where both the concentration of the arsine and the concentration of the hydrogen selenide are a predetermined threshold concentration or less, film formation is started on a second substrate different from the first substrate.

On the other hand, in a case where either the concentration of the arsine or the concentration of the hydrogen selenide is higher than a predetermined threshold concentration, the film formation on the second substrate is not performed, and the first inspection, the second inspection, and the opening of the process chamber 14 to the atmosphere are performed. The first inspection, the second inspection, and the opening of the process chamber 14 to the atmosphere are similar to those of the first embodiment.

In the film forming method according to the third embodiment, it is checked by using the first detector 22 that the concentration of the hydrogenated gas in the first exhaust gas exhausted from the process chamber 14 after the normal film formation is ended is a predetermined threshold concentration or less. In the film forming method according to the third embodiment, the abnormality of the inside of the process chamber 14 is detected by measuring the generation situation of the hydrogenated gas after the normal film formation is ended. That is, it is determined whether the inside of the process chamber 14 is in an abnormal state where, for example, a large amount of the hydrogenated gas is generated.

In a case where an abnormality is detected, the continuation of the film formation is ended, the process chamber 14 is opened to the atmosphere, and the abnormal state of the inside of the process chamber 14 is eliminated. For example, cleaning of the inside of the process chamber 14, replacement of parts, or the like is performed.

As described above, according to the third embodiment, it is possible to suppress the diffusion of the hydrogenated gas to the outside of the apparatus.

Fourth Embodiment

A film forming apparatus according to a fourth embodiment is different from the film forming apparatuses according to the first and second embodiments in that the film forming apparatus further includes a housing that surrounds the first detector and a second detector that is provided in a second flow path of the second exhaust gas exhausted from the housing and can detect the hydrogenated gas. Hereinafter, a portion of the description of contents overlapping with those of the first embodiment and the second embodiment will be omitted.

Figure 11:
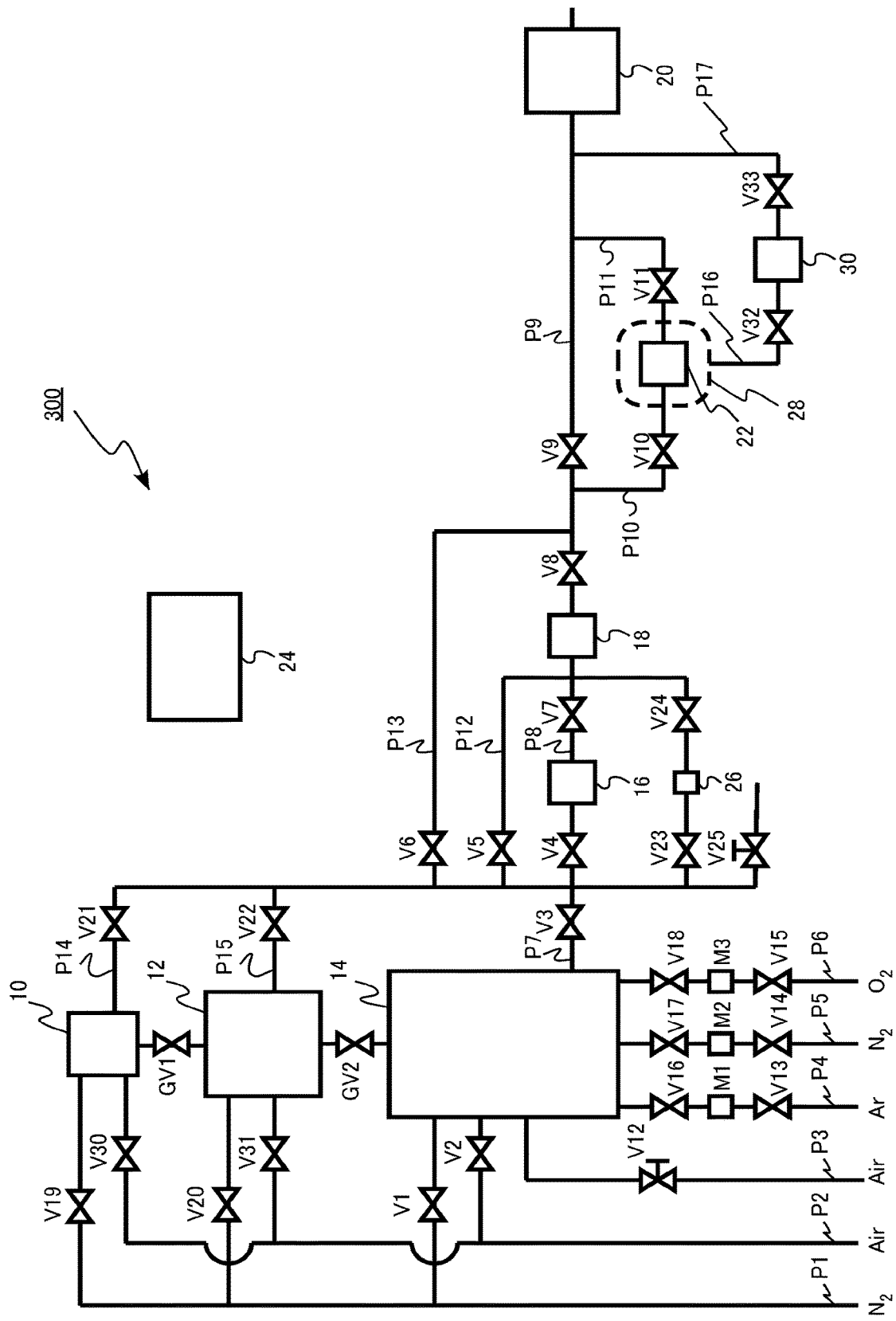
FIG. 11 is a schematic diagram of a film forming apparatus according to a fourth embodiment.

FIG. 11 is a schematic diagram of the film forming apparatus according to the fourth embodiment. FIG. 11 is a diagram illustrating a configuration of the film forming apparatus. The film forming apparatus according to the fourth embodiment is a sputtering apparatus 300 that forms a deposited film on a surface of a substrate such as a semiconductor wafer by using a sputtering method.

The sputtering apparatus 300 according to the fourth embodiment includes a load lock chamber 10, a transfer chamber 12, a process chamber 14, a turbomolecular pump 16, a dry pump 18, and an abatement device 20, a first detector 22, a controller 24, a quadrupole mass spectrometer 26, a housing 28, and a second detector 30. In addition, the sputtering apparatus 300 includes pipes P1 to P17, valves V1 to V33, gate valves GV1 and GV2, and mass flow controllers M1, M2, and M3.

The first flow path of the first exhaust gas exhausted from the process chamber 14 includes pipes P7, P8, P9, P10, P11, P12, and P13. The third flow path of the third exhaust gas exhausted from the load lock chamber 10 includes pipes P14, P7, P8, P9, P10, P11, P12 and P13. The second flow path of the second exhaust gas exhausted from the housing 28 includes a pipe P16, a pipe P17, and a pipe P9. The second flow path is connected to the abatement device 20.

The housing 28 surrounds the first detector 22. The housing 28 seals the first detector 22 with high airtightness.

The inside of the housing 28 is connected to the second detector 30 by using the pipe P16. The second exhaust gas exhausted from the inside of the housing 28 is moved into the second detector 30.

The second detector 30 is provided between the pipe P16 and the pipe P17. The pipe P17 is connected to the pipe P9.

The second detector 30 can detect the hydrogenated gas. The hydrogenated gas is a gas of a hydride that is a compound containing hydrogen. The hydrogenated gas is, for example, arsine ($AsH_3$) or hydrogen selenide ($H_2Se$). The second detector 30 measures the concentration of the hydrogenated gas contained in the second exhaust gas exhausted from the housing 28.

The second detector 30 has, for example, a first gas detector and a second gas detector. The first gas detector can detect the first hydrogenated gas. In addition, the second gas detector can detect a second hydrogenated gas different from the first hydrogenated gas. The first hydrogenated gas is, for example, arsine. The second hydrogenated gas is, for example, hydrogen selenide.

The first gas detector measures, for example, the concentration of the arsine contained in the second exhaust gas exhausted from the housing 28. In addition, the second gas detector measures, for example, the concentration of the hydrogen selenide contained in the second exhaust gas exhausted from the housing 28.

The second detector 30 has, for example, a configuration similar to that of the first detector 22 illustrated in FIG. 3.

The second exhaust gas that has passed through the second detector 30 is returned to the pipe P9 through the pipe P17.

For example, the first gas detector 22a and the second gas detector 22b used in the first detector 22 do not necessarily have high airtightness with respect to the gas to be measured. For this reason, there is a concern that the toxic hydrogenated gas may diffuse from the first detector 22 to the outside of the apparatus.

In the sputtering apparatus 300 according to the fourth embodiment, the first detector 22 is surrounded by a housing having high airtightness. Therefore, the diffusion of the toxic hydrogenated gas from the first detector 22 to the outside of the apparatus is suppressed.

Then, the hydrogenated gas in the second exhaust gas that has passed through the first detector 22 is toxicity-abated by the abatement device 20, and is released to the outside of the sputtering apparatus 300. Therefore, the diffusion of the toxic hydrogenated gas to the outside of the sputtering apparatus 300 is suppressed.

Further, the concentration of the hydrogenated gas diffusing from the first detector 22 can be managed by the second detector 30.

As described above, according to the fourth embodiment, it is possible to suppress the diffusion of the hydrogenated gas to the outside of the apparatus.

Fifth Embodiment

A film forming apparatus according to a fifth embodiment is different from the film forming apparatus according to the first embodiment in that the film forming apparatus further includes a circulation flow path, one end of which is connected to the first flow path between the first detector and the abatement device and the other end of which is connected to the exhaust pipe of the transfer chamber. Hereinafter, a portion of the description of contents overlapping with that of the first embodiment will be omitted.

Figure 12:
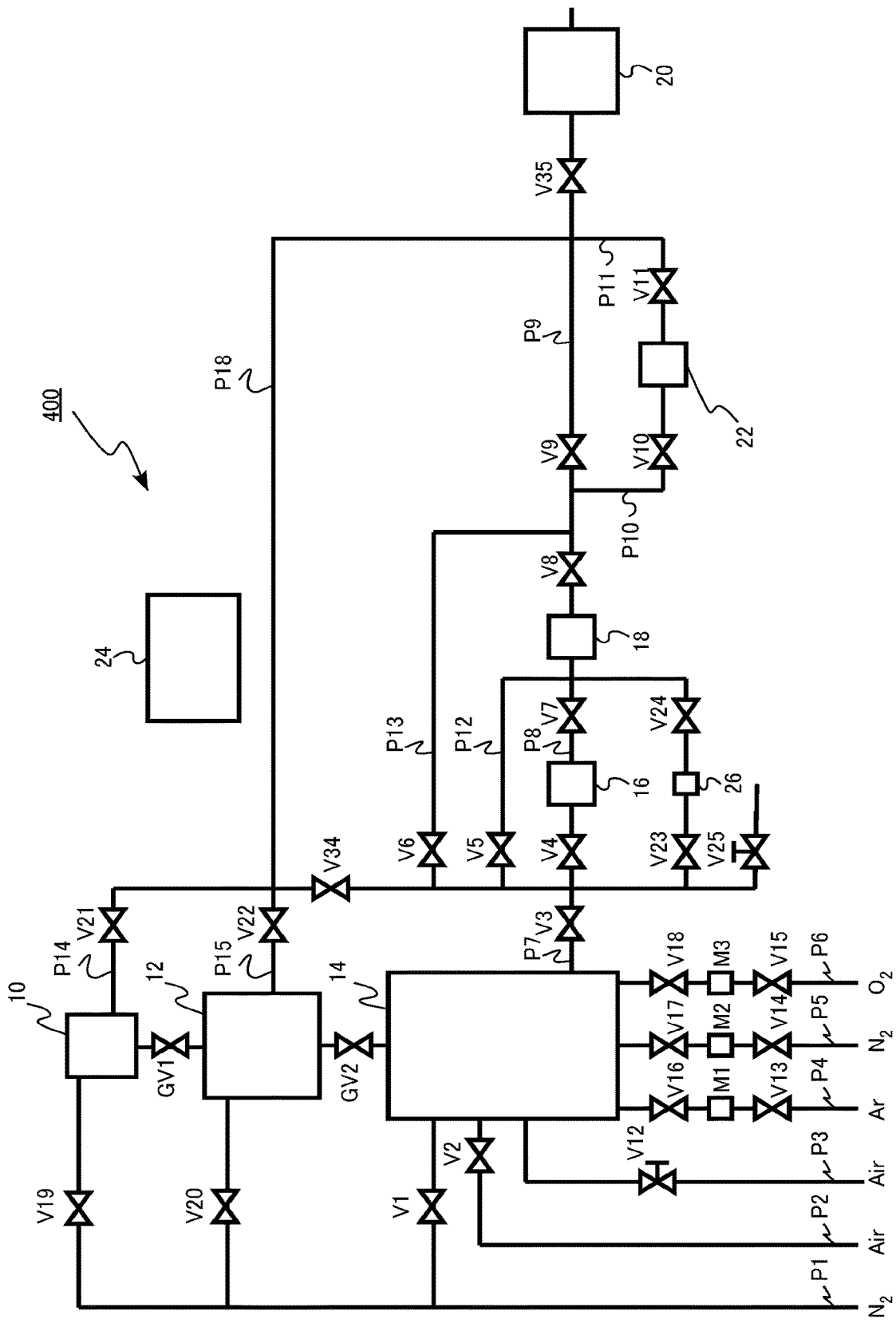
FIG. 12 is a schematic diagram of a film forming apparatus according to a fifth embodiment.

FIG. 12 is a schematic diagram of the film forming apparatus according to the fifth embodiment. FIG. 12 is a diagram illustrating a configuration of the film forming apparatus. The film forming apparatus according to the fifth embodiment is a sputtering apparatus 400 that forms a deposited film on a surface of a substrate such as a semiconductor wafer by using a sputtering method.

The sputtering apparatus 400 according to the fifth embodiment includes a load lock chamber 10, a transfer chamber 12, a process chamber 14, a turbomolecular pump 16, a dry pump 18, and an abatement device 20, a first detector 22, a controller 24, and a quadrupole mass spectrometer 26. In addition, the sputtering apparatus 400 includes pipes P1 to P15 and P18, valves V1 to V29, V34, and V35, gate valves GV1 and GV2, and mass flow controllers M1, M2 and M3.

The first flow path of the first exhaust gas exhausted from the process chamber 14 includes pipes P7, P8, P9, P10, P11, P12, and P13.

The sputtering apparatus 400 includes a pipe P18 having one end connected to the first flow path between the first detector 22 and the abatement device 20 and the other end connected to the pipe P15. The pipe P18 is an example of the circulation flow path. The pipe P15 is an example of the exhaust pipe of the transfer chamber 12. A method of opening the transfer chamber 12 and the process chamber 14 of the sputtering apparatus 400 to the atmosphere is described.

First, for example, the valves V2, V3, V6, V10, V11, and V22 and the gate valve GV2 are opened. The other valves and gate valves are closed.

By opening the valve V2, the atmosphere is supplied from the pipe P2 into the process chamber 14. The exhaust gas exhausted from the process chamber 14 passes through the pipe P7, the pipe P13, the pipe P10, the first detector 22, the pipe P11, the pipe P18, the pipe P15, the transfer chamber 12, and the gate valve GV2 and returns to the process chamber 14. That is, the exhaust gas exhausted from the process chamber 14 circulates through the first detector 22 and the circulation flow path. The exhaust gas is circulated by, for example, a pump (not illustrated) provided in the first detector 22.

For example, the valve V35 is opened at the time when the concentration of the toxic hydrogenated gas measured by the first detector 22 becomes a predetermined threshold concentration or less. By opening the valve V35, the exhaust gas is exhausted to the outside of the sputtering apparatus 400 through the abatement device 20. After that, the transfer chamber 12 and the process chamber 14 are opened to the atmosphere.

According to the sputtering apparatus 400 according to the fifth embodiment, it is possible to reduce the concentration of the hydrogenated gas in the exhaust gas in a state where the pressure in the process chamber 14 is not depressurized and a constant pressure is maintained. Therefore, the concentration of the toxic hydrogenated gas can be reduced in a short time.

As described above, according to the fifth embodiment, it is possible to suppress the diffusion of the hydrogenated gas to the outside of the apparatus.

In addition, in the fifth embodiment, a case where the circulation flow path is added to the sputtering apparatus 100 according to the first embodiment has been described as an example, but, the circulation flow path can be added to, for example, the sputtering apparatus 200 according to the second embodiment or the sputtering apparatus 300 according to the fourth embodiment.

In the first to fifth embodiments, the sputtering apparatus has been described as an example of the film forming apparatus, but the embodiments can also be applied to a film forming apparatus, for example, a chemical vapor deposition apparatus (CVD apparatus) other than the sputtering apparatus.

In the first to fourth embodiments, the configuration in which the diffusion of the hydrogenated gas from the process chamber 14 and the load lock chamber 10 to the outside of the apparatus is suppressed has been described as an example, but the embodiments can also be applied to the transfer chamber 12.

In the first to fifth embodiments, arsine and hydrogen selenide are described as examples of the toxic hydrogenated gases, but the embodiments are also effective for other toxic hydrogenated gases.

In the first to fifth embodiments, the case of forming a film containing arsenic (As), selenium (Se), germanium (Ge), and silicon (Si) has been described as an example, but the embodiments can also be applied to the cases of forming the other films.

In the first to fifth embodiments, a case where the measurement of the concentration of the arsine and the measurement of the concentration of the hydrogen selenide are performed with a time difference has been described as an example. However, for example, the measurement of the concentration of the arsine and the hydrogen selenide are performed. It is also possible to adopt a configuration in which the concentration of is measured at the same time.

In the first to fifth embodiments, a case where the gas containing water is the atmosphere has been described as an example, but the gas containing water is not necessarily limited to the atmosphere. For example, the nitrogen gas containing water, the argon gas containing water, or the like may be used.

In the first to fifth embodiments, a case where the load lock chamber 10, the transfer chamber 12, and the process chamber 14 share a vacuum pump has been described as an example. However, for example, each of the load lock chamber 10, the transfer chamber 12, and the process chamber 14 may be provided with a separate vacuum pump.

In the fourth embodiment, a case where the second flow path is connected to the abatement device has been described as an example, but the second flow path may be configured not to be connected to the abatement device.

While certain embodiments have been described, these embodiments have been presented by way of example only, and are not intended to limit the scope of the inventions. Indeed, film forming apparatuses and film forming methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A film forming apparatus comprising:
   a process chamber forming a film on a substrate;
   an abatement device detoxifying a first exhaust gas exhausted from the process chamber;
   a first supply pipe supplying a gas containing water to the process chamber;
   a first vacuum pump provided in a first flow path of the first exhaust gas between the process chamber and the abatement device;
   a second vacuum pump provided in the first flow path between the first vacuum pump and the abatement device; and
   a first detector provided in the first flow path between the second vacuum pump and the abatement device, the first detector detecting a hydrogenated gas,
   wherein the first detector includes a first gas detector detecting a first hydrogenated gas and a second gas detector detecting a second hydrogenated gas different from the first hydrogenated gas.

2. The film forming apparatus according to claim 1, further comprising:
   a housing surrounding the first detector; and
   a second detector provided in a second flow path of a second exhaust gas exhausted from the housing, the second detector detecting a hydrogenated gas.

3. The film forming apparatus according to claim 2, wherein the second flow path is connected to the abatement device.

4. The film forming apparatus according to claim 1, further comprising a second supply pipe supplying a nitrogen gas to the process chamber.

5. The film forming apparatus according to claim 1, wherein the process chamber includes a holder holding a target, and the target is a raw material of the film.

6. The film forming apparatus according to claim 5, further comprising a third supply pipe supplying an argon gas to the process chamber.

7. The film forming apparatus according to claim 1, wherein the first detector detects arsine and a hydrogen selenide.

8. The film forming apparatus according to claim 1, wherein the first flow path includes a first bypass flow path bypassing the first vacuum pump.

9. The film forming apparatus according to claim 1, wherein the first flow path includes a second bypass flow path bypassing the first vacuum pump and the second vacuum pump.

10. The film forming apparatus according to claim 1, further comprising a controller controlling supply of the gas containing water to the process chamber, a flow of the first exhaust gas in the first flow path, and detection of the hydrogenated gas in the first detector, on the basis of a detection result of the hydrogenated gas in the first detector.

11. The film forming apparatus according to claim 1, further comprising:
    a load lock chamber loading or unloading the substrate into or from the process chamber; and
    a fourth supply pipe supplying a gas containing water to the load lock chamber.

12. The film forming apparatus according to claim 11, further comprising a fifth supply pipe supplying a nitrogen gas to the load lock chamber.

13. The film forming apparatus according to claim 11, wherein the first detector is provided in a third flow path of a third exhaust gas exhausted from the load lock chamber.

14. A film forming apparatus comprising:
    a process chamber forming a film on a substrate, the process chamber configured to attach an abatement device detoxifying a first exhaust gas, a first vacuum pump provided in a first flow path including an exhaust pipe between the process chamber and the abatement device, a second vacuum pump provided in the first flow path between the first vacuum pump and the abatement device, and a first detector provided in the first flow path between the second vacuum pump and the abatement device and detecting a hydrogenated gas;
    a first supply pipe supplying a gas containing water to the process chamber;
    the exhaust pipe of the first exhaust gas exhausted from the process chamber; and
    a controller, wherein the controller controls supply of the gas containing water to the process chamber, a flow of the first exhaust gas in the first flow path, and detection of the hydrogenated gas in the first detector, on the basis of a detection result of the hydrogenated gas in the first detector, and wherein the film forming apparatus further comprises:
a load lock chamber loading or unloading the substrate into or from the process chamber; and
a third supply pipe supplying a gas containing water to the load lock chamber.

15. The film forming apparatus according to claim 14, further comprising a second supply pipe supplying a nitrogen gas to the process chamber.

16. The film forming apparatus according to claim 14, wherein the process chamber includes a holder holding a target, and the target is a raw material of the film.

17. A film forming method comprising:
loading a substrate into a load lock chamber of a film forming apparatus;
reducing a pressure in the load lock chamber;
moving the substrate from the load lock chamber to a process chamber;
forming a film on the substrate in the process chamber;
moving the substrate from the process chamber to the load lock chamber;
supplying a gas containing water into the load lock chamber;
performing a first inspection measuring a first concentration of a hydrogenated gas in an exhaust gas exhausted from the load lock chamber in a state where a pressure in the load lock chamber is a first pressure; and
unloading the substrate to an outside of the load lock chamber after the first concentration becomes a predetermined threshold concentration or less in the first inspection.

18. The film forming method according to claim 17, wherein the measurement of the first concentration is repeated multiple times in the first inspection.

19. The film forming method according to claim 17, further comprising:
supplying a gas containing water into the load lock chamber after the first concentration becomes a predetermined threshold concentration or less in the first inspection, before the unloading the substrate;
performing a second inspection measuring a second concentration of a hydrogenated gas in an exhaust gas exhausted from the load lock chamber in a state of a second pressure of a pressure in the load lock chamber being higher than the first pressure,
wherein, after the second concentration becomes a predetermined threshold concentration or less in the second inspection, the unloading the substrate is performed.

20. The film forming method according to claim 17, wherein the film is formed by a sputtering method.

21. The film forming method according to claim 17, wherein the film is a film containing arsenic or selenium.

* * * * *